(12) United States Patent
Hembree et al.

(10) Patent No.: US 7,282,806 B2
(45) Date of Patent: Oct. 16, 2007

(54) SEMICONDUCTOR DEVICES AT LEAST PARTIALLY COVERED BY A COMPOSITE COATING INCLUDING PARTICLES DISPERSED THROUGH PHOTOPOLYMER MATERIAL

(75) Inventors: David R. Hembree, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/516,422

(22) Filed: Sep. 5, 2006

(65) Prior Publication Data

US 2007/0001321 A1 Jan. 4, 2007

Related U.S. Application Data

(63) Continuation of application No. 10/867,257, filed on Jun. 14, 2004.

(51) Int. Cl.
*H01L 23/28* (2006.01)
*H01L 23/29* (2006.01)
*H01L 23/02* (2006.01)
*H01L 23/053* (2006.01)
*H01L 23/14* (2006.01)

(52) U.S. Cl. ............ 257/787; 257/685; 257/701; 257/702; 257/704; 257/723; 257/788

(58) Field of Classification Search ........ 257/685, 257/701–702, 704, 723, 787–788
See application file for complete search history.

(56) References Cited

U.S. PATENT DOCUMENTS

| | | | |
|---|---|---|---|
| 3,976,288 A | 8/1976 | Cuomo, Jr. | |
| 4,925,515 A | 5/1990 | Yoshimura et al. | |
| 5,087,964 A | 2/1992 | Hatta | |
| 5,173,220 A | 12/1992 | Reiff et al. | |
| 5,264,061 A | 11/1993 | Juskey et al. | |
| 5,439,622 A | 8/1995 | Pennisi et al. | |
| 5,460,703 A | 10/1995 | Nulman et al. | |
| 5,547,906 A | 8/1996 | Badehi | |
| 5,600,181 A | 2/1997 | Scott et al. | |
| 5,659,478 A | 8/1997 | Pennisi et al. | |
| 5,675,402 A | 10/1997 | Cho et al. | |
| 5,705,016 A | 1/1998 | Senoo et al. | |
| 5,818,005 A | 10/1998 | Pratt et al. | |
| 5,827,394 A | 10/1998 | Lu | |
| 5,833,869 A | 11/1998 | Haas et al. | |
| 5,869,354 A | 2/1999 | Leedy | |
| 5,937,265 A | 8/1999 | Pratt et al. | |

(Continued)

OTHER PUBLICATIONS

Accelerated Technologies First to Offer New Composite Stereolithography Material, www.acceleratedtechnologies.com.
Circuit Board Protection—Potting, Encapsulation, Conformal Coating, & Gasketing Materials, pp. 29-32, www.loctite.com/electronics.

(Continued)

*Primary Examiner*—Ida M. Soward
(74) *Attorney, Agent, or Firm*—TraskBritt

(57) ABSTRACT

Devices include at least one semiconductor die including at least one surface that is at least partially covered by a photopolymer material. The photopolymer material includes a plurality of discrete particles dispersed through a polymerized matrix. In some embodiments, the photopolymer material may cover at least a portion of each of a plurality of semiconductor dice attached to a substrate. Furthermore, the photopolymer material may cover only a portion of each of the plurality of semiconductor dice, and another photopolymer material may cover another portion of each of the plurality of semiconductor dice.

20 Claims, 9 Drawing Sheets

U.S. PATENT DOCUMENTS

| | | | |
|---|---|---|---|
| 5,953,590 | A | 9/1999 | Piper et al. |
| 5,998,867 | A | 12/1999 | Jensen et al. |
| 6,039,830 | A | 3/2000 | Park et al. |
| 6,048,948 | A | 4/2000 | Tochioka |
| 6,099,783 | A | 8/2000 | Scranton et al. |
| 6,140,151 | A | 10/2000 | Akram |
| 6,150,240 | A | 11/2000 | Lee et al. |
| 6,245,646 | B1 | 6/2001 | Roberts |
| 6,251,488 | B1 | 6/2001 | Miller et al. |
| 6,259,962 | B1 | 7/2001 | Gothait |
| 6,268,584 | B1 | 7/2001 | Keicher et al. |
| 6,283,997 | B1 | 9/2001 | Garg et al. |
| 6,284,072 | B1 | 9/2001 | Ryan et al. |
| 6,303,469 | B1 | 10/2001 | Larson et al. |
| 6,322,598 | B1 | 11/2001 | Meuris et al. |
| 6,323,295 | B1 | 11/2001 | Muhlebach et al. |
| 6,323,436 | B1 | 11/2001 | Hedrick et al. |
| 6,326,698 | B1 | 12/2001 | Akram |
| 6,337,122 | B1 | 1/2002 | Grigg et al. |
| 6,344,402 | B1 | 2/2002 | Sekiya |
| 6,353,257 | B1 | 3/2002 | Huang |
| 6,391,251 | B1 | 5/2002 | Keicher et al. |
| 6,399,464 | B1 | 6/2002 | Muntifering et al. |
| 6,407,334 | B1 | 6/2002 | Jimarez et al. |
| 6,432,752 | B1 | 8/2002 | Farnworth |
| 6,465,329 | B1 | 10/2002 | Glenn |
| 6,471,806 | B1 | 10/2002 | McKenna et al. |
| 6,472,294 | B2 | 10/2002 | Meuris et al. |
| 6,482,576 | B1 | 11/2002 | Farnworth et al. |
| 6,483,719 | B1 | 11/2002 | Bachman |
| 6,498,074 | B2 | 12/2002 | Siniaguine et al. |
| 6,500,746 | B2 | 12/2002 | Williams |
| 6,509,636 | B1 | 1/2003 | Tsai et al. |
| 6,514,798 | B2 | 2/2003 | Farnworth |
| 6,518,662 | B1 | 2/2003 | Smith et al. |
| 6,524,346 | B1 | 2/2003 | Farnworth |
| 6,524,881 | B1 | 2/2003 | Tandy et al. |
| 6,537,482 | B1 | 3/2003 | Farnworth |
| 6,544,465 | B1 | 4/2003 | Farnworth et al. |
| 6,544,821 | B2 | 4/2003 | Akram |
| 6,544,902 | B1 | 4/2003 | Farnworth |
| 6,549,821 | B1 | 4/2003 | Farnworth et al. |
| 6,551,906 | B2 | 4/2003 | Oka |
| 6,562,278 | B1 | 5/2003 | Farnworth et al. |
| 6,562,661 | B2 | 5/2003 | Grigg |
| 6,569,709 | B2 | 5/2003 | Derderian |
| 6,569,753 | B1 | 5/2003 | Akram et al. |
| 6,582,983 | B1 | 6/2003 | Runyon et al. |
| 6,585,927 | B2 | 7/2003 | Grigg et al. |
| 6,593,171 | B2 | 7/2003 | Farnworth |
| 6,607,689 | B1 | 8/2003 | Farnworth |
| 6,611,053 | B2 | 8/2003 | Akram |
| 6,686,225 | B2 | 2/2004 | Wachtler |
| 6,696,752 | B2 | 2/2004 | Su et al. |
| 6,713,857 | B1 | 3/2004 | Tsai |
| 6,734,032 | B2 | 5/2004 | Tandy et al. |
| 6,740,962 | B1 | 5/2004 | Grigg |
| 6,746,899 | B2 | 6/2004 | Grigg |
| 6,762,502 | B1 | 7/2004 | Akram |
| 6,833,627 | B2 | 12/2004 | Farnworth |
| 6,849,915 | B1 | 2/2005 | Tsai |
| 6,875,640 | B1 | 4/2005 | Farnworth et al. |
| 6,908,784 | B1 | 6/2005 | Farnworth |
| 6,940,181 | B2 | 9/2005 | Derderian et al. |
| 6,949,834 | B2 | 9/2005 | Connell et al. |
| 6,963,127 | B2 * | 11/2005 | Akram .................. 257/690 |
| 7,084,474 | B2 | 8/2006 | Hung et al. |
| 7,087,984 | B2 * | 8/2006 | Akram .................. 257/669 |
| 7,138,695 | B2 | 11/2006 | Kim et al. |
| 7,215,015 | B2 | 5/2007 | Moden |
| 2001/0051395 | A1 * | 12/2001 | Grigg .................. 438/107 |
| 2002/0016387 | A1 | 2/2002 | Shen |
| 2002/0159242 | A1 | 10/2002 | Nakatani et al. |
| 2002/0171177 | A1 | 11/2002 | Kritchman et al. |
| 2003/0043360 | A1 | 3/2003 | Farnworth |
| 2003/0059708 | A1 | 3/2003 | Yamamura et al. |
| 2003/0068840 | A1 * | 4/2003 | Grigg .................. 438/106 |
| 2003/0151167 | A1 | 8/2003 | Kritchman et al. |
| 2004/0165362 | A1 | 8/2004 | Farnworth |
| 2004/0229002 | A1 | 11/2004 | Davis et al. |
| 2005/0059188 | A1 | 3/2005 | Bolken et al. |
| 2005/0064681 | A1 | 3/2005 | Wood et al. |
| 2005/0064683 | A1 | 3/2005 | Farnworth |
| 2005/0082651 | A1 | 4/2005 | Farnworth et al. |
| 2005/0218518 | A1 | 10/2005 | Jiang et al. |
| 2006/0261458 | A1 | 11/2006 | Paek et al. |

OTHER PUBLICATIONS

Miller, Doyle, "New Laser-Directed Deposition Technology," Microelectronic Fabrication, www.hdi-online.com, HDI, p. 16, Aug. 2001.

Miller, Doyle, et al., "Maskless Mesoscale Materials Deposition," Deposition Technology, www.hdi-online.com, HDI, pp. 20-22, Sep. 2001.

Objet FullCure™ 700 Series, Photopolymer Materials and Support Resins (2 pages), © 2003 Objet Geometries, Ltd. Objet™, etc.

Objet Prototyping the Future, How it Works (2 pages), 2003 by Objet Geometries Ltd. Ltd.

PNI/Plastics News International, Applied Machinery Pty Ltd, Buy & Sell Plastics Machinery, Jan. 10, 2004, www.plasticsnews.net.

* cited by examiner

SEMICONDUCTOR DEVICES AT LEAST PARTIALLY COVERED BY A COMPOSITE COATING INCLUDING PARTICLES DISPERSED THROUGH PHOTOPOLYMER MATERIAL

CROSS-REFERENCE TO RELATED APPLICATION

This application is a continuation of application Ser. No. 10/867,257, filed Jun. 14, 2004, pending.

BACKGROUND OF THE INVENTION

1. Field of the Invention

The present invention relates to the underfilling and encapsulation of semiconductor devices on a carrier substrate. More specifically, the present invention relates to a method of fabricating a semiconductor assembly, wherein the underfill and encapsulation materials may exhibit differing material properties and are formed using stereolithography.

2. State of the Art

Flip-chip style packaging for semiconductor dice is becoming ever more popular. In a flip-chip package, an array or pattern of external conductive elements such as solder bumps, or conductive or conductor-filled epoxy pillars, protrude from the active surface of the semiconductor die for use in mechanically and electrically connecting the semiconductor die to the patterned ends of conductive traces of higher level packaging, such as a carrier substrate.

There is typically a substantial mismatch in the coefficient of thermal expansion (CTE) between the material of the semiconductor die and that of the carrier substrate, such as a printed circuit board or interposer, bearing the conductive traces to which the external conductive elements of the die are bonded. Due to this substantial CTE mismatch, significant stresses develop between the semiconductor die and carrier substrate during normal thermal cycling. Without a strong mechanical attachment of the semiconductor die to the substrate, the die may debond from the carrier substrate, or one or more of the external conductive elements may fracture or release from its corresponding conductive trace. In addition, the small spacing or pitch of the external conductive elements creates a significant potential for shorting between adjacent conductive elements or conductive elements and adjacent carrier substrate traces due to the presence of a dust particle or condensed moisture between the semiconductor die and the carrier substrate. Therefore, when a flip-chip type of electronic device, such as a semiconductor die, is conductively attached to a carrier substrate, underfilling the space between the device and substrate with an electrically insulative material is very desirable to enhance the mechanical bond between the die and the carrier substrate and to dielectrically isolate adjacent electrical connections between the die and the carrier substrate.

In the past, underfilling has been achieved using a dielectric, polymeric material that is heated to a temperature sufficient for it to flow. A vacuum source is typically used to draw the heated, viscous, dielectric material to fill the region between the substrate and the semiconductor die. However, effecting adequate removal of air, water vapor, and moisture from between the substrate and the semiconductor die has always been a problem associated with the conventional underfill process. A more controlled and precise manufacturing technique termed "stereolithography," also known as "layered manufacturing," has been employed recently to form the underfill and encapsulation region in semiconductor packages.

A representative patent disclosing forming the underfill and encapsulation structures of semiconductor device assemblies using stereolithography, assigned to the current assignee of the present application, is U.S. Pat. No. 6,537, 482 to Farnworth (hereinafter "the '482 Farnworth Patent"), the disclosure of which is herein incorporated by reference. As shown in FIG. 1, the '482 Farnworth Patent discloses semiconductor device assembly 40 having an underfill and encapsulation region formed using stereolithography. Semiconductor dice 20 having an active surface 22, backside 18, and lateral sides 24 is illustrated having a flip-chip configuration using a ball grid array (BGA) of external conductive elements 30 bonded to a plurality of conductive bond pads 32 contained on the active surface 22. The external conductive elements 30 are bonded to conductive traces 14 on the face 12 of the carrier substrate 10. An underfill 50 is formed of a polymerized material that fills the spaces 34 between each semiconductor die 20 and the carrier substrate 10. An encapsulation region 48 formed of a polymerized material, contiguous with the underfill 50, seals and protects each semiconductor die 20. The underfill 50 and the encapsulation region 48 are formed by immersing the semiconductor device assembly to a predetermined depth in a bath of a liquid photopolymer resin and subsequently curing it using either a controlled light source, thermal process, or both. The process is repeated as necessary to form the complete semiconductor package as exemplified by the semiconductor device assembly 40 shown in FIG. 1.

While the '482 Farnworth Patent provides a useful method for encapsulating and underfilling a semiconductor die to form a semiconductor package, it is limited to forming the underfill and encapsulation regions from a photopolymerizable material having uniform material properties and formed from conventional photopolymerizable materials. Therefore, it is desirable to develop a method that enables varying the photopolymerizable material used to form the underfill and encapsulation regions of the semiconductor package. Furthermore, it would be desirable to tailor the material properties of the photopolymerizable material used to form the underfill and encapsulation structures in specific regions to reduce the thermal stresses experienced by the semiconductor package in service and enable protection of the semiconductor package from external elements.

BRIEF SUMMARY OF THE INVENTION

The present invention, in a number of embodiments, includes underfill and encapsulation structures using a variety of photopolymerizable materials exhibiting differing material properties to package semiconductor devices and assemblies. Methods for fabricating the semiconductor packages employing stereolithography are also disclosed.

In a broad exemplary embodiment, a semiconductor device assembly includes at least one semiconductor die having a back side and an active surface including a plurality of discrete conductive elements projecting therefrom. The discrete conductive elements of the at least one semiconductor die are in electrical communication with a plurality of conductive traces of a carrier substrate. At least a portion of the semiconductor device assembly may be covered with a cured photopolymer material, wherein the cured photopolymer material includes a polymerized matrix having a plurality of discrete particles dispersed therethrough.

In an exemplary embodiment, the discrete particles of the cured photopolymer material may be formed from a material such as, for example, boron nitride, which enables efficient heat transfer from the semiconductor device assembly. The cured photopolymer material may form an underfill structure between the at least one semiconductor die and the carrier substrate. In another exemplary embodiment, the cured photopolymer material may further sealingly enclose the at least one semiconductor die.

In another exemplary embodiment, a first cured photopolymer material may underfill the region between the at least one semiconductor die and the carrier substrate and cover at least portions of the lateral sides of the semiconductor die. A second cured photopolymer material that includes a polymerized matrix having a plurality of discrete particles dispersed therethrough formed from a material such as, for example, boron nitride, may cover the backside of the at least one semiconductor die to form a contiguous structure with the first cured photopolymer material. In another exemplary embodiment, the second cured photopolymer material may exhibit an electrical conductivity greater than that of the first polymerized material forming the underfill structure. The second cured photopolymer material may include a plurality of conductive particles formed from elemental metals or alloys to at least partially surround the at least one semiconductor die and improve electrostatic discharge protection and radio frequency shielding.

In yet another exemplary embodiment, the underfill structure that fills the region between the at least one semiconductor die and the carrier substrate may be formed from at least two layers of cured photopolymer materials. This underfill structure exhibits a coefficient of thermal expansion (CTE) gradient that decreases in a direction from the carrier substrate to the opposing face of the semiconductor die. By tailoring the CTE of each layer of cured photopolymer material, the thermal stresses caused by the CTE difference between carrier substrate and the at least one semiconductor die may be reduced. Additional photopolymer materials may be used to at least partially enclose the at least one semiconductor die.

In yet another exemplary embodiment, a semiconductor package for packaging an array of optically interactive semiconductor devices is disclosed. An array of optically interactive semiconductor devices may be surrounded by a substantially opaque support structure formed from a first cured photopolymer material. In another exemplary embodiment, a second cured photopolymer material covers the array of optically interactive semiconductor devices to protect the array.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention, in a number of embodiments, employs stereolithography processing to form the packaging for semiconductor devices and semiconductor assemblies. In accordance with the present invention, liquid photopolymerizable resins exhibiting different material properties when cured may be used to form various regions of underfill and encapsulation structures to tailor the material properties thereof for specific applications.

The semiconductor packages of the present invention may be formed using stereolithography systems known in the art. One such system is disclosed in the aforementioned '482 Farnworth Patent. The reader is directed to the disclosure of the '482 Farnworth Patent for specific details; however, the general aspects of the stereolithography system will be elaborated below in the description of FIG. 2.

Figure 1:
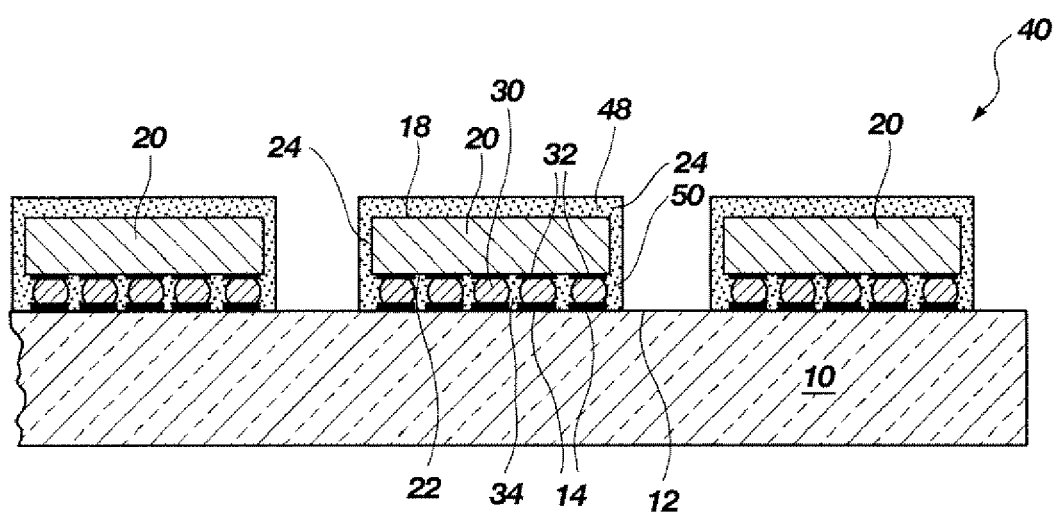
FIG. 1 illustrates a sectional view of a prior art semiconductor device assembly.
Figure 2:
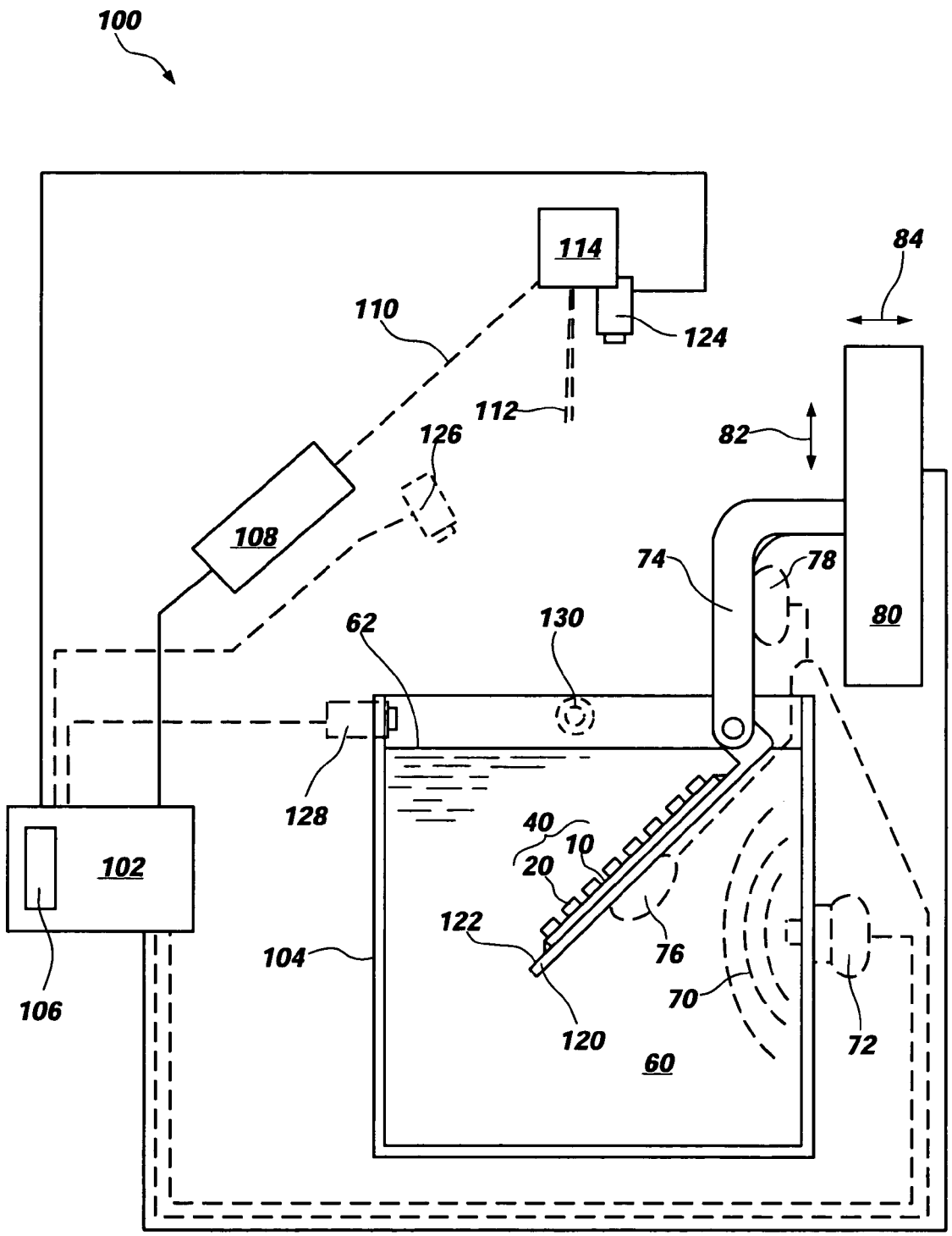
FIG. 2 illustrates a stereolithography apparatus that may be used to practice the present invention.

FIG. 2 schematically illustrates a stereolithographic apparatus 100 for underfilling, encapsulating, and forming other various structures for packaging semiconductor devices and assemblies. A plurality of flip-chip semiconductor dice 20 mounted on a carrier substrate 10 is shown in FIG. 2. The apparatus 100 is shown in a purge mode, wherein semiconductor device assembly 40 is mounted on a support surface 122 of a manipulatable support platform 120, tilted and immersed in a reservoir of liquid photopolymer resin 60. Purge mode, as used in the art, means immersing the semiconductor assembly 40 at an angle in order to assist with removal of gases, water vapor, and moisture from the interstitial volume between the carrier substrate 10 and the semiconductor die 20. Platform 120 is supported by and manipulated in a vertical direction 82 and preferably in a horizontal direction 84 as well, by motion actuator 80 acting through arm 74 to insert and remove the semiconductor assembly 40 into the reservoir 104 of liquid photopolymer 60. Reservoir 104 may be configured to be removable from the apparatus 100 to enable replacing the reservoir 104 with a different reservoir 104 containing a new liquid photopolymer resin 60 or the reservoir 104 may be drained and re-filled with a new liquid photopolymer resin 60. The motion actuator 80 as well as the generator 72, vibration element 76 or 78 are controlled by a program operating in computer (microprocessor) 102 and stored in memory 106. A generally low-power vibration 70 may be applied to the liquid photopolymer 60 by sonic or ultrasonic generator 72 or, alternatively, a vibration element 76 or 78 may be connected to the platform 120. FIG. 2 also illustrates other parts of the stereolithography apparatus 100 not typically used in the purge mode, such as laser 108 configured to project a laser beam 10, beam mirror 114 and camera 124, and optional cameras 126, 128 and 130. As known in the art, a data file containing the structure of the underfill and encapsulation structure, and the intermediate structures to be formed using the stereolithography apparatus 100 are stored in the memory of computer 102. The data files may be a 3-D CAD file or, preferably, a Stereolithography (STL) file as employed by most stereolithography equipment manufacturers.

The semiconductor assembly 40 supported by platform 120 may be immersed into the reservoir 104 of liquid photopolymer resin 60 covering the semiconductor device assembly 40 with a precise amount of liquid photopolymer 60. While still submerged and positioned to be substantially horizontal, the layer of liquid photopolymer covering the semiconductor assembly 40 may then be irradiated by the beam 112 to cure or partially cure at least a portion of it. The individual stereolithographic acts required to form the underfill and encapsulation structures of the present invention are discussed in more detail below with respect to FIGS. 3-12. The surface level 62 of the liquid photopolymer resin 60 is automatically maintained at an extremely precise, constant magnitude by devices known in the art responsive to output of level sensors, not shown, within the apparatus 100 and preferably under control of computer 102.

The semiconductor packages of the present invention may use polymerized materials formed by modifying a variety of commercially available liquid photopolymer resins 60. Suitable photopolymers for use in practicing the present invention include, without limitation, ACCURA® SI 40 HC and AR materials and CIBATOOL SL 5170 and SL 5210 resins for the SLA® 250/50HR and SLA® 500 systems, ACCURA® SI $40_{ND}$ material and CIBATOOL SL 5530 resin for the SLA® 5000 and 7000 systems, and CIBATOOL SL 7510 resin for the SLA® 7000 system. The ACCURA® materials are available from 3D Systems, Inc., of Valencia, Calif., while the CIBATOOL resins are available from Ciba Specialty Chemicals Company of Basel, Switzerland. Additional photopolymers that are suitable for use in practicing the present invention include, without limitation, Loctite® 5071, 5084, 5088, and 5089 silicone-based materials available from Henkel Loctite Corp., of Industry, Calif. The liquid photopolymer resins 60 may be mixed with a particulate filler constituent to enable tailoring and adjustment of the material properties of photopolymer upon being cured. The particulate filler constituent is typically in the range of about 5:m to 15:m in particle size, so as to be small enough to fill any voids and other features into which the liquid photopolymer is to flow. However, the size of the particulate filler constituent is not critical within the foregoing constraint and may be selected to enable a substantially uniform distribution of suspended particles within the liquid photopolymer resin 60 and to prevent agglomeration of the particles. Exemplary filler constituents may be selected from boron nitride, silicates, elemental metals, and alloys. Thus, by selecting the appropriate filler constituent, the physical properties of the polymerized material may be tailored to fulfill the needs of particular applications. A more thermally conductive polymerized material may be formed by adding a filler constituent, such as boron nitride, that exhibits a thermal conductivity greater than that of the liquid photopolymer resin 60 it is dispersed therethrough. The CTE of the polymerized material may be decreased by adding a filler constituent having a CTE that is less than the CTE of the liquid photopolymer resin 60 in a cured, unfilled state. The degree of CTE adjustment may, of course, be dependent on the filler volume and particle size employed. Exemplary filler constituents for decreasing the CTE of polymerized material include filler constituents such as, for example, silicates or boron nitride. The electrical conductivity of the polymerized material may, also, be increased relative to the liquid photopolymer resin 60 by adding a conductive filler constituent such as, for example, elemental metals or alloys. The degree to which the filler constituents alter the physical properties of the liquid photopolymer resin 60 is generally governed by a rule of mixtures type of formula. Upon curing or at least partially curing to at least a semisolid state, the cured photopolymer material exhibits a polymerized matrix having a plurality of discrete particles (i.e., the filler constituent) dispersed therethrough.

The liquid photopolymer resin 60 is responsive to light in the UV wavelength range such that it at least partially cures or polymerizes upon exposure to UV wavelength light to form a semisolid structure. The liquid photopolymer resin 60 may also be cured by other means, such as elevated temperature, to become a fully cured polymeric structure. Furthermore, with regard to the liquid photopolymer resins 60 that include filler constituents, as the volume percent of the filler constituent is increased in the liquid photopolymer 60, the thickness that may be partially cured using UV light to a semisolid state decreases. A thickness of about $18 \times 10^{-3}$ inches may be partially cured to a semisolid state if the liquid photopolymer resin 60 does not posses any filler constituent. A thickness of about $4.5 \times 10^{-3}$ inches may be partially cured to a semisolid state if the liquid photopolymer resin 60 possesses about 50 volume percent filler constituent.

Figure 3:
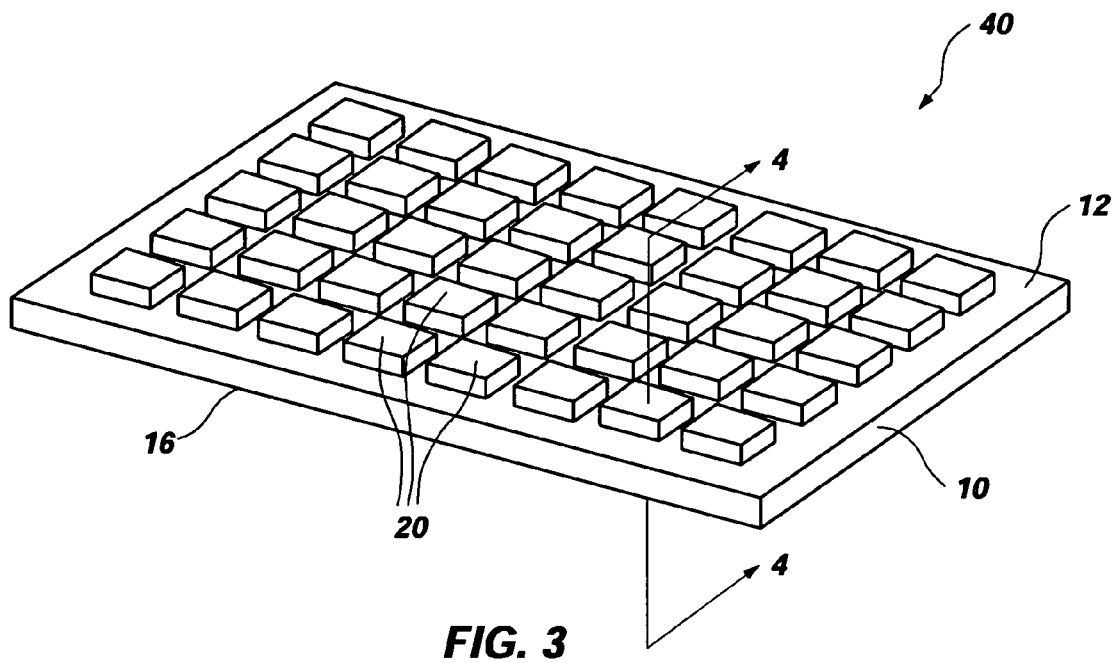
FIG. 3 illustrates a perspective view of an exemplary semiconductor device assembly having a flip-chip configuration.
Figure 4:
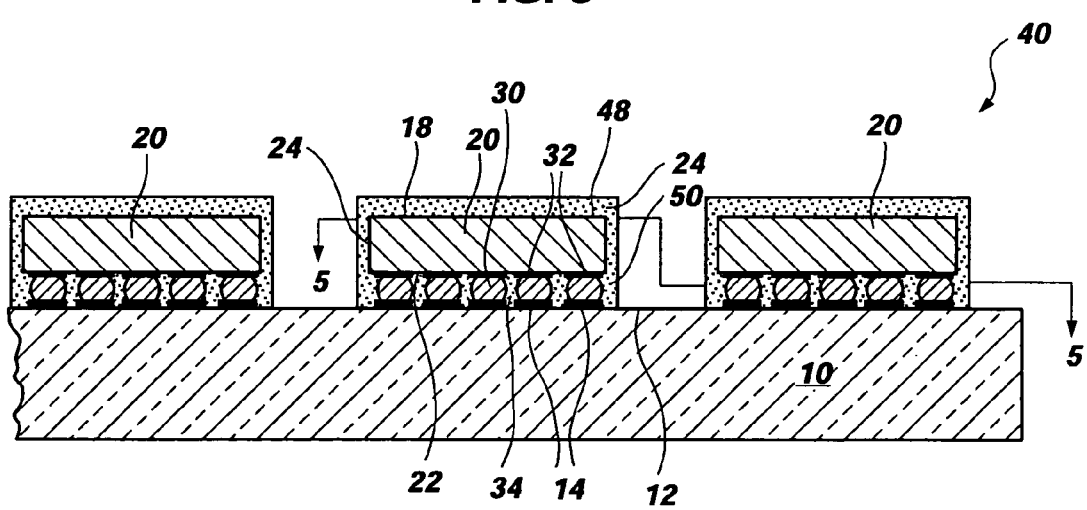
FIG. 4 illustrates a sectional view of the semiconductor device assembly of FIG. 3 taken along line 4-4.
Figure 5:
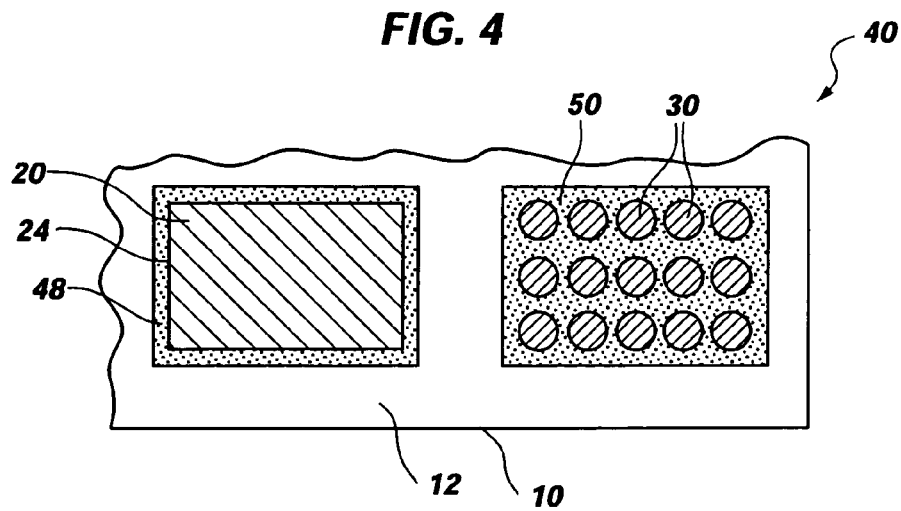
FIG. 5 illustrates a sectional view of the semiconductor device assembly of FIG. 4 taken along line 5-5.

An exemplary semiconductor device assembly 40 formed in accordance with the present invention is shown in FIGS. 3, 4 and 5. The semiconductor device assembly 40 comprises a carrier substrate 10 such as a printed circuit board, interposer or other substrate to which external conductive elements 30 such as conductive balls, bumps or columns protruding from the active surface 22 of one or more flip-chip semiconductor dice 20 are bonded through conductive traces 14 on the planar carrier substrate face 12. The exemplary carrier substrate 10 is shown as having a generally planar backside 16. However, the method may be applied to carrier substrates 10 and semiconductor dice 20 of any configuration, where a volume or space therebetween requires underfilling. The present invention comprises a method for underfilling the volume between a semiconductor die 20 mounted on a carrier substrate 10 and encompasses extension of the underfill to encapsulate the semiconductor die 20 in the same process.

In FIG. 4, exemplary semiconductor dice 20 are illustrated as having a flip-chip configuration, each having a ball grid array (BGA) of external conductive elements 30 such as solder balls or conductive or conductor-filled epoxy on active surface 22, and having a back side 18 and lateral sides 24. The external conductive elements 30 are shown as being bonded to the plurality of conductive pads 32 on the active surface 22 and to conductive trace pads 14 on the face 12 of carrier substrate 10. The external conductive elements 30 may be bonded to the conductive trace pads 14 by heat-induced reflow in the case of solder or by curing in the case of epoxy, using any effective method such as is known in the art.

As shown in FIGS. 4 and 5, an underfill structure 50 formed of a cured photopolymer material essentially fills the interstitial volume or spaces 34 between each semiconductor die 20 and the carrier substrate 10, including the crevices where the external conductive elements 30 meet the active surface 22 and the carrier substrate face 12. The underfill 50 is tightly adhered to the active surface 22 and the carrier substrate face 12 to mechanically attach the semiconductor die 20 to the carrier substrate 10. Contiguous with the underfill 50 is an encapsulation region 48 of protective cured photopolymer material which is shown as covering the four lateral sides 24 and backside 18 of each semiconductor die 20. The underfill structure 50, together with the encapsulation region 48, form a polymeric protective package, that seals and protects each semiconductor dice 20. Because of the unique method by which the underfill structure 50 is formed, there are essentially no bubbles of air or other gas, water vapor, or moisture in any other form within the underfill 50. Thus, any opportunity for short-circuiting between external conductive elements 30, the plurality of bonds pads 32, and conductive trace pads 14 is virtually eliminated. Further, the highly conformal underfill structure helps to support the external conductive elements 30.

Referring to FIG. 4, in an exemplary embodiment of the present invention, the underfill structure 50 and the encapsulation structure 48 may be formed from a thermally conductive polymerized material. The polymerized material may be formed from a liquid photopolymer resin 60 that includes a filler constituent such as, for example, boron nitride for increasing the thermal conductivity thereof. By forming the underfill structure 50 and the encapsulation structure 48 from a polymerized material of enhanced thermal conductivity, heat transfer from the semiconductor die 20 during service is improved.

Figure 6A:
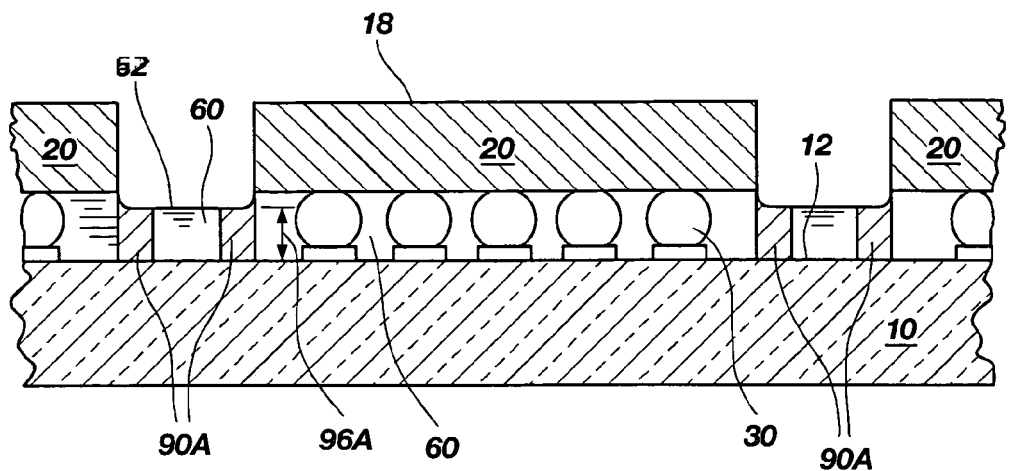
FIGS. 6A through 6C illustrate an exemplary method for fabricating the present invention.
Figure 6B:
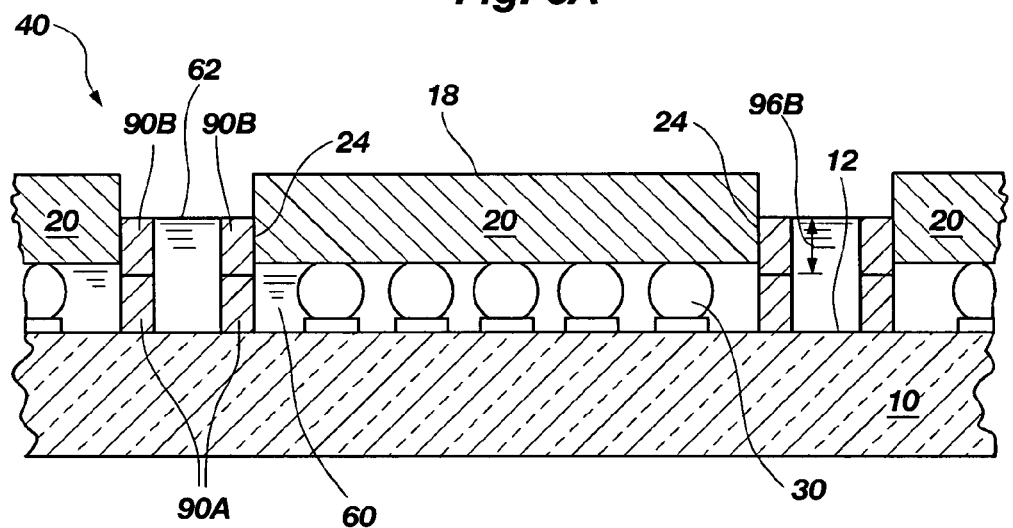

An exemplary method for forming the underfill structure 50 and encapsulation structure 48 is described with reference to FIGS. 6A-6C. The semiconductor assembly 40 is immersed in the reservoir 104 of liquid photopolymer resin 60 to a predetermined depth 96A below the surface level 62 of the liquid photopolymer resin 60. The laser 108 scans the liquid photopolymer resin 60 in selected portions to at least partially cure (partially polymerize) the liquid photopolymer resin 60 to form structures 90A that retain an uncured pool of the liquid photopolymer 60 between the carrier substrate 10 and the semiconductor die 20, as shown in FIG. 6A. As shown in FIG. 6B, the semiconductor assembly 40 may be further immersed to a predetermined depth 96B below the surface level 62 of the liquid photopolymer resin 60. Again, the laser 108 scans the liquid photopolymer resin 60 in selected portions to form another partially cured structure 90B that is bonded to and contiguous with the structure 90A between as shown in FIG. 6B. As depicted, for illustrative purposes in FIG. 6B, structures 90A and 90B form a dam structure that sealingly retains liquid photopolymer resin 60 between the carrier substrate face 12 and the semiconductor die 20. Although the process is illustrated using only two layers (90A and 90B), fewer layers may be used or additional layers may be used, as required, to form additional dam structures. The number of layers used in this iterative process is determined by thickness of liquid photopolymer resin 60 that may be partially cured by the laser 108 into a semisolid state.

Figure 6C:
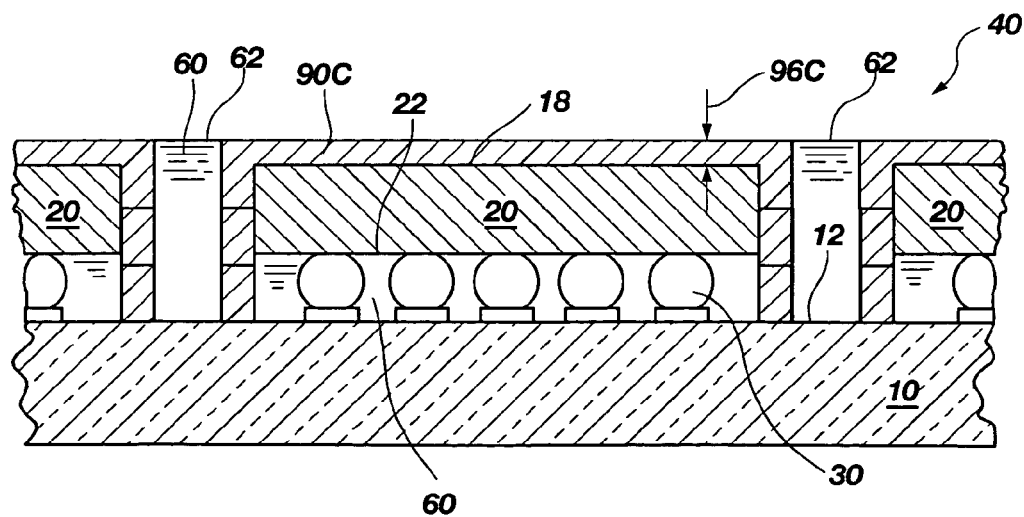

As illustrated in FIG. 6C, the process is repeated, to further submerge the backside 18 of the semiconductor die 20 to a predetermined depth 96C below the surface level 62 of the reservoir 60 to at least partially cure the liquid photopolymer resin 60 to complete the encapsulation structure 48 by forming structure 90C. The liquid photopolymer resin 60 remaining on the semiconductor device assembly 40 is then drained. However, the interstitial volume between the carrier substrate face 12 and the semiconductor die 20 is filled with the liquid photopolymer resin 60 that is sealingly retained therebetween by structures 90A and 90B. The partially cured structures that comprise the encapsulation structure 48 and the uncured liquid photopolymer remaining sealed between the carrier substrate face 12 and semiconductor die 20 may be fully cured by moving the semiconductor device assembly 40 to another apparatus, such as a furnace, to fully cure both the partially cured structure comprising the encapsulation structure 48 and the underfill structure 50 by heating to an elevated temperature to form a contiguous unitary structure. The resultant fully cured encapsulation structure 48 and underfill structure 50 is shown in the aforementioned FIG. 4.

Figure 7:
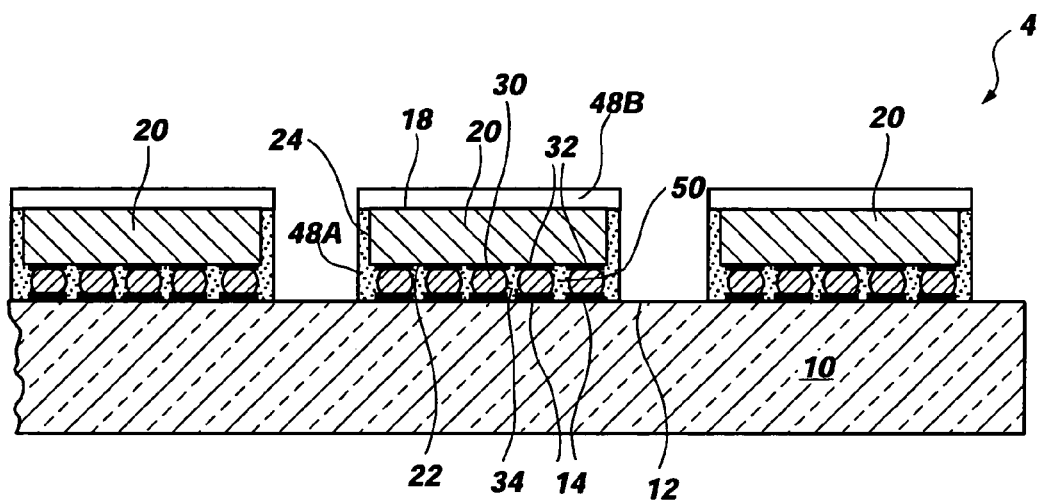
FIG. 7 illustrates a sectional view of another exemplary semiconductor device assembly employing two different types of photopolymer materials to form the semiconductor package.

Referring to FIG. 7, in another exemplary embodiment of the present invention, the encapsulation structure 48A substantially covering the four lateral sides 24 and the underfill structure 50 filling the spaces 34 between each semiconductor die 20 and the carrier substrate 10 may be formed from a dielectric polymerized material. The dielectric polymerized material may be formed from a conventional liquid photopolymer resin 60 such as the aforementioned commercially available photopolymers resins (i.e., without an additional filler constituent). Such dielectric polymerized materials are thermal insulators. The encapsulation structure 48A formed from the same dielectric material as underfill structure 50 is contiguous with the underfill structure 50 and substantially covers the four lateral sides 24 of the semiconductor die 20. The encapsulation structure 48B may be formed from a photopolymer material exhibiting thermally conductive properties greater than that of the polymerized material used for the encapsulation structure 48A and the underfill structure 50. Thus, the photopolymer material employed for forming the encapsulation structure 48B may be formed from a liquid photopolymer resin 60 that includes a filler constituent such as, for example, boron nitride for increasing the thermal conductivity thereof. As with the embodiment shown in FIG. 4, by forming the encapsulation region 48B from a thermally conductive polymerized material, more efficient heat transfer from semiconductor die 20 is effected.

The underfill structure 50 and the encapsulation structures 48A and 48B of the embodiment shown in FIG. 7 may be formed in a similar manner to that described in the aforementioned FIGS. 6A-6C. The encapsulation structure 48A may be formed by immersing the semiconductor device assembly 40 and selectively partially curing the liquid photopolymer resin 60 by exposure to laser 108 to substantially surround the four lateral sides 24 of the semiconductor die 20 and sealingly retain liquid photopolymer resin 60 in the space between the carrier substrate face 12 and the semiconductor die 20. The encapsulation structure 48A may be formed using an iterative process that builds the encapsulation structure 48A from multiple layers, if needed. The remaining liquid photopolymer resin 60 is drained from the semiconductor device assembly 40. The liquid photopolymer 60 is replaced in the reservoir 104 with a liquid photopolymer resin 60 that includes a filler constituent such as, for example, boron nitride for increasing the thermal conductivity thereof or the entire reservoir 104 may be replaced. Alternatively, reservoir 104 may be replaced with another reservoir 104 containing the liquid photopolymer resin 60 with the filler constituent, or the assembly transferred to another stereolithography apparatus 100 including a reservoir 104 with the particle-filled liquid photopolymer resin 60. The semiconductor device assembly 40 is then immersed in the liquid photopolymer resin 60 that includes a filler constituent and the encapsulation region 48B is partially cured by exposure to the laser 108. The encapsulation structure 48A including the uncured liquid photopolymer resin 60 retained between the carrier substrate 10 and the semiconductor die 20 and encapsulation structure 48B are then fully cured by heating to an elevated temperature.

Figure 8A:
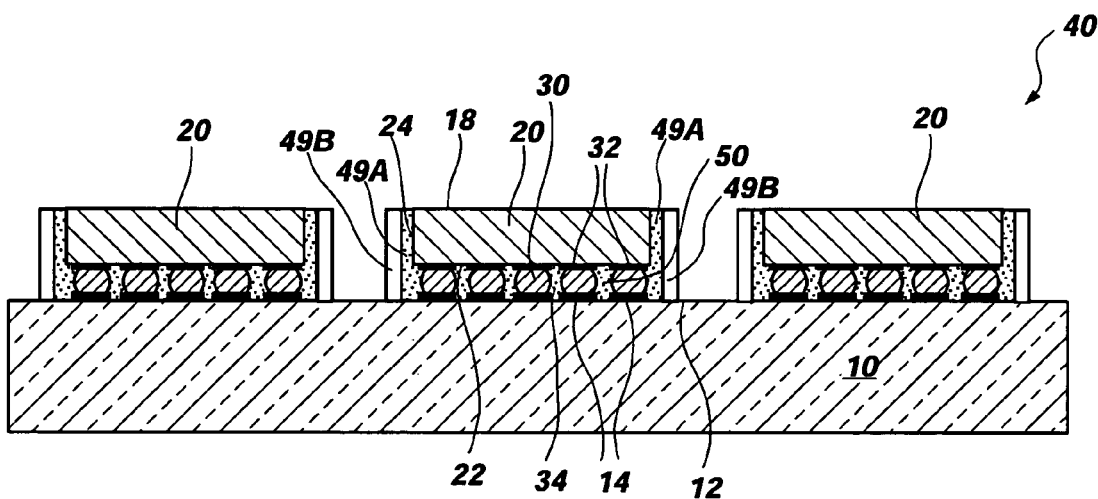
FIGS. 8A and 8B illustrate sectional views of exemplary semiconductor device assemblies employing two different types of photopolymer materials to form the semiconductor package.
Figure 8B:
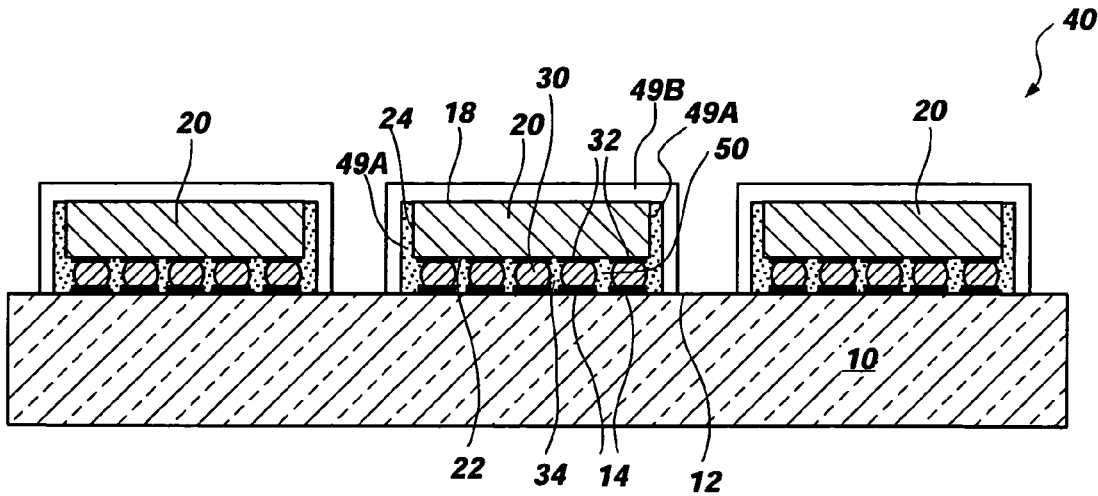

Referring to FIGS. 8A and 8B, in another exemplary embodiment, the underfill structure 50 filling the spaces 34 between each semiconductor die 20 and the carrier substrate 10 and the encapsulation structure 49A that covers the four lateral sides 24 of the semiconductor die 20 may be formed from a dielectric polymerized material. The dielectric polymerized material may be formed from a conventional liquid photopolymer resin 60 such as the aforementioned commercially available photopolymers (i.e., lacking an additional filler constituent). As shown in FIG. 8A, the encapsulation structure 49B may partially enclose each semiconductor die 20 including the underfill structure 50 and the encapsulation structure 49A to cover the lateral sides of each semiconductor die 20. The encapsulation structure 49B may also cover the backside 18 of each semiconductor die 20 to completely enclose each semiconductor die 20 as shown in FIG. 8B. The encapsulation structure 49B may be formed from a photopolymer material exhibiting properties that enable electrostatic discharge (ESD) protection and radio frequency (RF) shielding. A suitable photopolymer material employed for forming the encapsulation structure 49B may be formed from a liquid photopolymer resin 60 that includes a filler constituent such as, for example, an elemental metal or alloy for increasing the electrical conductivity thereof. The encapsulation structure 49B, formed from a cured photopolymer material, exhibits a sufficient electrical conductivity to assist with ESD protection and RF shielding.

The underfill structure 50 and the encapsulation structures 49A and 49B of the embodiment shown in FIG. 8 may be formed in a similar manner to that described in the aforementioned FIGS. 6A-6C. The encapsulation structure 49A may be formed by immersing the semiconductor device assembly 40 and partially curing the liquid photopolymer resin 60 by exposure to laser 108 to substantially surround the four lateral sides 24 of the semiconductor die 20 and sealingly retain liquid photopolymer resin 60 in the space between the carrier substrate face 12 and the semiconductor die 20. The encapsulation structure 49A may be formed using an iterative process that builds the encapsulation structure 49A from multiple layers. The remaining liquid photopolymer resin 60 is drained from the semiconductor device assembly 40. The semiconductor device assembly 40 is then immersed in the liquid photopolymer resin 60 that includes a filler constituent such as, for example, an elemental metal or alloy for increasing the electrical conductivity thereof and the encapsulation structure 49B is partially cured by exposure to a laser 108 in multiple layers depending on the height of the encapsulation structure 49B. The encapsulation structure 49A including the uncured liquid photopolymer resin 60 retained between the carrier substrate 10 and the semiconductor die 20, encapsulation structure 49B, and the underfill structure 50, are then fully cured by heating to an elevated temperature.

Figure 9A:
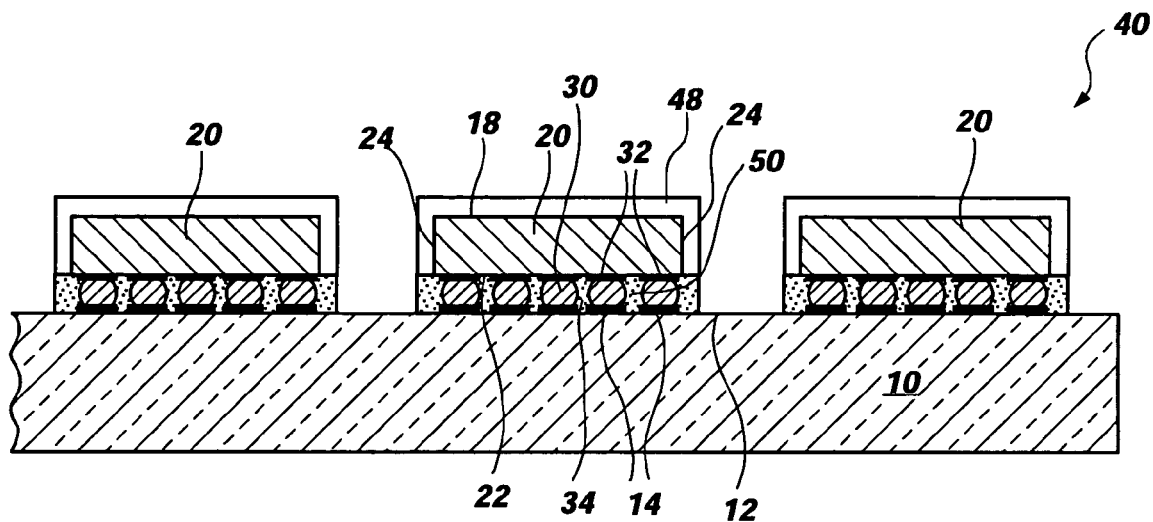
FIGS. 9A through 9C illustrate a sectional view of another exemplary semiconductor device assembly having a layered underfill structure.
Figure 9B:
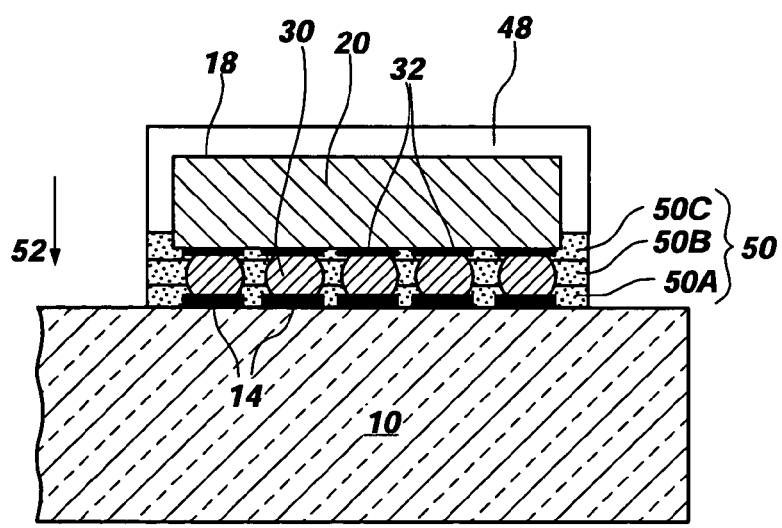

Referring to FIGS. 9A and 9B, in another exemplary embodiment, the underfill structure 50 may be comprised of multiple layers, wherein each layer exhibits a different CTE. The CTE of the layer nearest to the active surface 22 of the semiconductor die 20 closely matches that of the CTE of the semiconductor die 20, while the CTE of the layer nearest the carrier substrate face 12 closely matches the CTE of the carrier substrate 10. The CTE of each layer of cured photopolymer material that comprises the underfill structure 50 progressively increases in a direction from the active surface 22 of the semiconductor die 20 to the carrier substrate face 12, with the CTE of the layer closest to the carrier substrate face 12 closely matching the CTE of the carrier substrate 10. This CTE gradient that increases from the active surface 22 of the semiconductor die 20 to the face 12 of the carrier substrate 10 alleviates the thermal stresses that develop during use of the semiconductor assembly 40 due to the substantial CTE mismatch between the semiconductor die 20 and the carrier substrate 10.

FIG. 9B illustrates a more detailed sectional view of a single semiconductor die 20 mounted on carrier substrate 10 employing a layered underfill structure 50. The underfill structure 50 may be comprised of multiple layers of a photopolymer material, wherein the CTE of each layer increases in the direction 52. Layer 50A may be comprised of, for example, a polymerized material having a CTE between about 15 to about 35 ppm. Layer 50B may be comprised of, for example, a photopolymer material having a CTE between about 8 to about 15 ppm. Layer 50C may be comprised of, for example, a photopolymer material having a CTE between about 5 to about 10 ppm. In the exemplary embodiment illustrated in FIGS. 9A and 9B, the CTE of the photopolymer material may be altered by adding a filler constituent such as, for example, silicates or boron nitride to the liquid photopolymer resin 60. The addition of silicates or boron nitride to the liquid photopolymer resin 60 decreases the CTE upon curing to form the polymerized material and the CTE may be adjusted by varying the volume of filler, particle size and material of the filler. Although the underfill structure 50 is shown being comprised of only three layers (50A-50C), it may comprise additional or fewer layers, if desired. Additionally, the encapsulation structure 48 may be comprised of a thermally conductive photopolymer material. The photopolymer material used for the encapsulation structure 48 may be formed from a liquid photopolymer resin 60 that includes a filler constituent such as, for example, boron nitride for increasing the thermal conductivity thereof. In addition, the entire underfill structure 50 and encapsulation structure 48 may be at least partially surrounded or completely enclosed by an electrically conductive photopolymer material 53, as shown in FIG. 9C, to enable ESD protection and RF shielding of the semiconductor die 20.

Figure 9C:
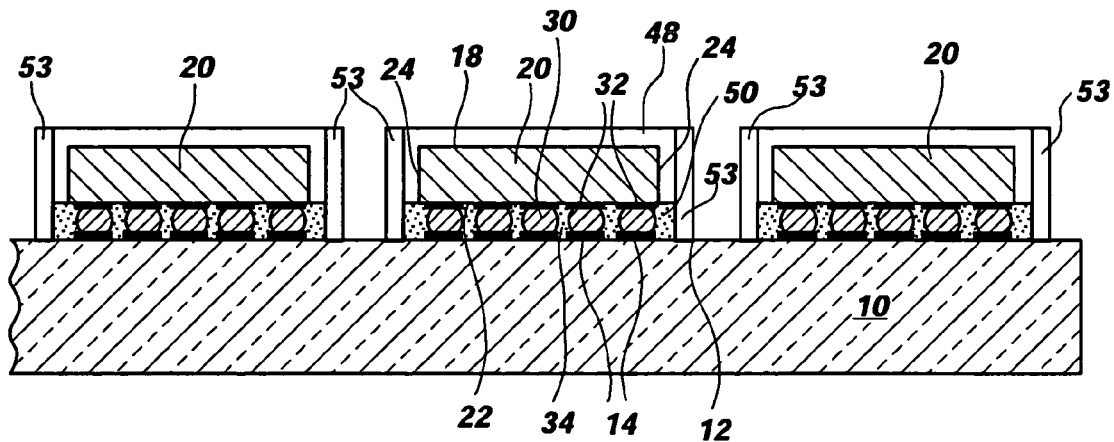
Figure 10A:
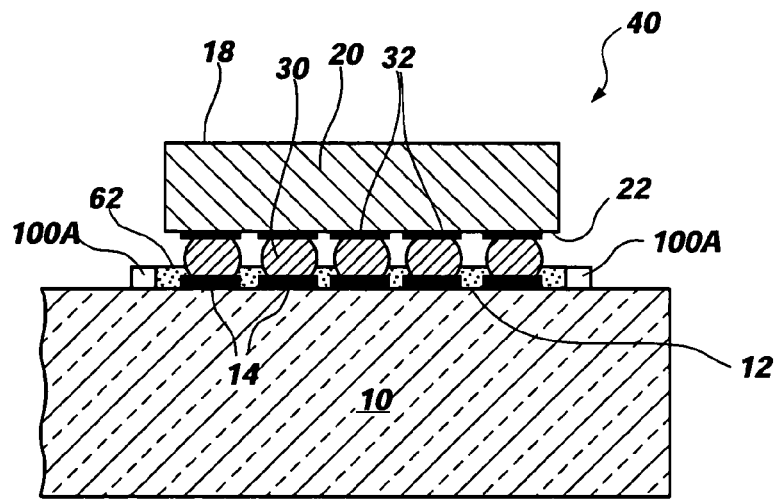
FIGS. 10A through 10C illustrate an exemplary process for forming the underfill and encapsulation structure shown in FIGS. 9A through 9C.
Figure 10B:
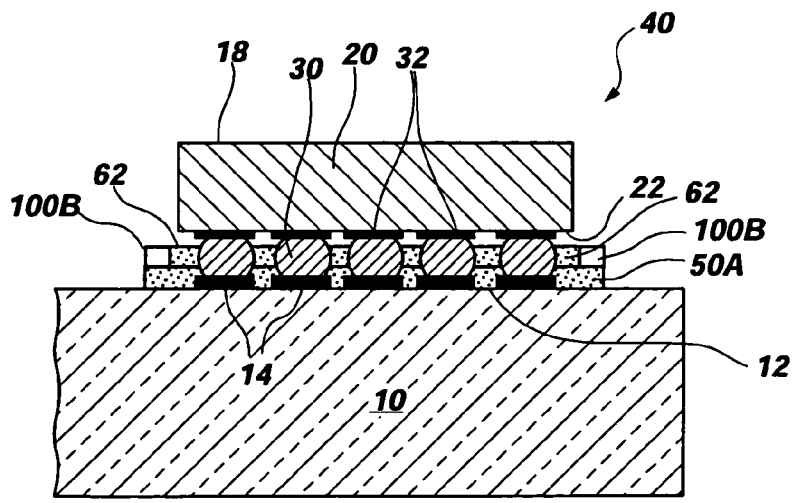
Figure 10C:
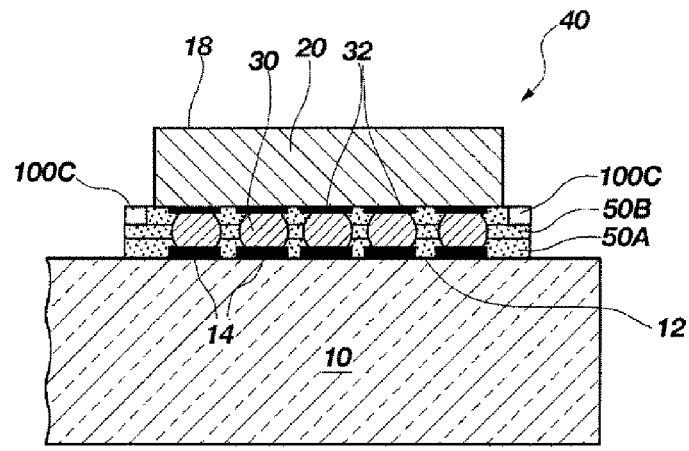

FIGS. 10A-10C briefly illustrate a process for forming the underfill structure 50 and encapsulation structure 48 shown in FIGS. 9A-9C. Referring to FIG. 10A, layer 50A of the underfill structure 50 may be formed by immersing the semiconductor device assembly 40 to a predetermined depth and partially curing the liquid photopolymer resin 60 by exposure to laser 108 to form structure 100A which completely surrounds the four lateral sides 24 of the semiconductor die 20. The semiconductor device assembly 40 is removed from the reservoir 104 and the excess liquid photopolymer resin 60 is drained. However, there remains uncured, liquid photopolymer resin 60 of a level 62 retained by structure 100A between the carrier substrate face 12 and the semiconductor die 20. The semiconductor device assembly 40 is then moved to an external heat source such as a quartz lamp or oven to cure, or at least partially cure, the remaining liquid photopolymer resin 60 retained between the carrier substrate face 12 and the semiconductor die 20 to form a unitary layer 50A. The liquid photopolymer resin 60 is replaced in the reservoir 104 with a second liquid photopolymer resin 60 that has a lower CTE than the liquid photopolymer resin 60 used for layer 50A, or the reservoir 104 may be replaced, or the assembly moved to a different stereolithography apparatus 100. Referring to FIG. 10B, the semiconductor device assembly 40 is immersed in the second liquid photopolymer resin 60 and partially cured by exposure to the laser 108 to form structure 100B that is bonded to and contiguous with structure 50A. The semiconductor device assembly 40 is removed from the reservoir 104 and the excess liquid photopolymer resin 60 is drained. As with forming the first layer 50A, there remains uncured, liquid photopolymer resin 60 of a level 62 retained by structures 100A and 100B between layer 50A and the semiconductor die 20. The semiconductor device assembly 40 is then moved to an external heat source to cure, or at least partially cure, the remaining liquid photopolymer resin 60 retained between the layer 50A and the semiconductor die 20 to form a unitary layer 50B. The liquid photopolymer resin 60 is replaced in the reservoir 104 with a third liquid photopolymer resin 60 that has a lower CTE than the liquid photopolymer resin 60 used for layer 50A and 50B, or the entire reservoir 104 may be replaced, or the assembly moved to another stereolithography apparatus 100.

Referring to FIG. 10C, the semiconductor device assembly 40 is then immersed in the third liquid photopolymer resin 60 and partially cured by exposure to the laser 108 to form structure 100C that is bonded to and contiguous with structure 100B. Structure 100C sealingly retains uncured, liquid photopolymer resin 60 between the layer 50B and the semiconductor die 20. The semiconductor device assembly 40 is removed from the reservoir 104 and the excess liquid photopolymer resin 60 is drained. As with forming the previous layers 50A and 50B, there remains uncured, liquid photopolymer resin 60 retained between the layer 50B and the semiconductor die 20. The semiconductor device assembly 40 may then be moved to an external heat source to cure, or at least partially cure, the remaining liquid photopolymer resin 60 retained between the layer 50B and the semiconductor die 20 to form a unitary layer 50C that seals and protects each semiconductor die 20. The encapsulation structure 48 may be formed by immersion of the semiconductor device assembly 40 to a predetermined depth within another reservoir 104 and subsequent exposure by a laser 108 to form the encapsulation structure 48 that is contiguous with the underfill structure 50 and covers the backside 18 of the semiconductor die 20, prior to or after forming unitary layer SOC. If desired, the semiconductor device assembly 40 may be immersed in a reservoir 104 containing a liquid photopolymer resin 60 that includes containing a filler constituent for increasing the electrical conductivity thereof and subsequently, partially curing by exposure to the laser 108 to form the electrically conductive polymerized material 53, as shown in FIG. 9C. The partially polymerized photopolymer materials that comprise the underfill structure 50, encapsulation structure 48, and if present, the electrically conductive photopolymer material 53 may be fully cured by heating to an elevated temperature.

Figure 11A:
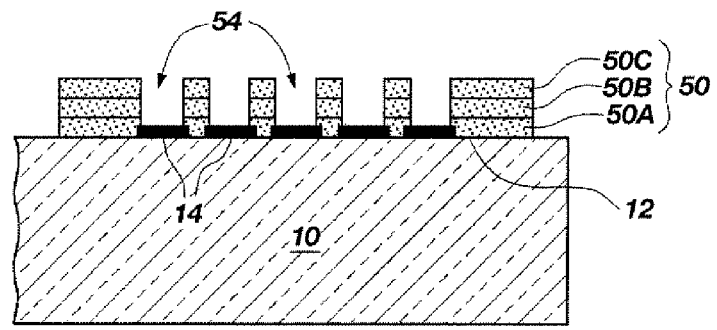
FIGS. 11A through 11C illustrate another exemplary process for forming the underfill and encapsulation structure shown in FIGS. 9A-9C.
Figure 11B:
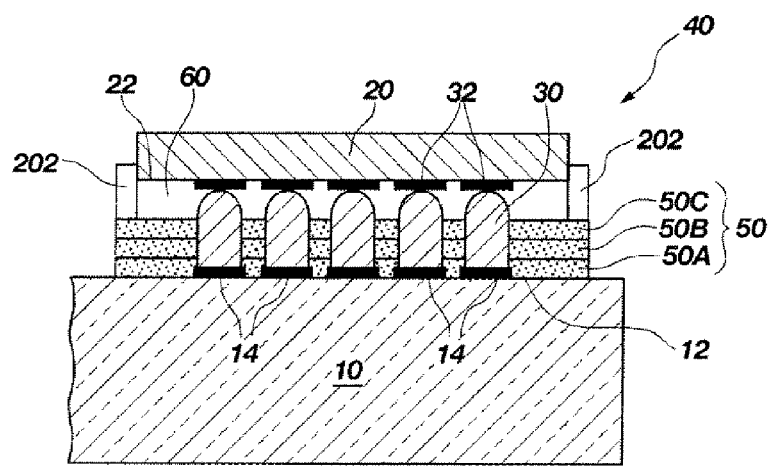
Figure 11C:
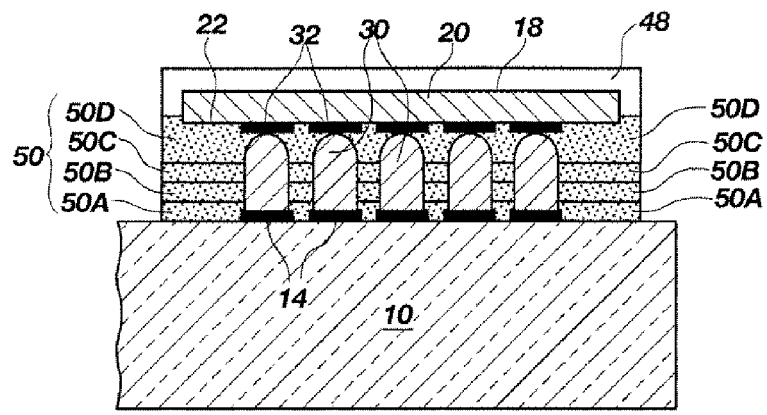

FIGS. 11A-11C briefly illustrate another exemplary process for forming the layered underfill 50 and encapsulation region 48 shown in FIGS. 9A-9C. As depicted in FIG. 11A, the layered underfill 50 may be formed on the carrier substrate face 12 with apertures 54 that expose the conductive traces 14. The external conductive elements 30, such as conductive or conductor-filled epoxy pillars or solder balls, may be stenciled so as to be deposited within apertures 54 contacting the conductive traces 14. Referring to FIG. 11B, conductive traces 14 and conductive bond pads or redistributed bond pads 32 on the active surface 22 of the semiconductor die 20 may be bonded to the external conductive elements 30 as known in the art, such as by solder reflow or by heating to cure and bond the epoxy pillars to the conductive traces 14 and bond pads 32. Also illustrated in FIG. 11B, the semiconductor device assembly 40 may then be immersed in the reservoir 104 to a predetermined depth and subsequently exposed to laser 108 to partially cure structures 202 that are bonded to and contiguous with layer 50C and sealingly retains uncured, liquid photopolymer resin 60 between the layer 50C and the semiconductor die 20. If desired, the entire assembly may be cured by heating to an elevated temperature to fully cure all of the layers 50A-50D that comprise the underfill 50 as shown in FIG. 11C. An encapsulation structure 48 may be formed by immersion of the semiconductor device assembly 40 to a predetermined depth within a reservoir 104 containing a liquid photopolymer resin 60 and subsequent exposure by laser 108 to form the encapsulation region 48 that is contiguous with the underfill 50 and covers the backside 18 of the semiconductor die. The encapsulation region 48 may be formed prior to or after fully curing the underfill 50. Although not shown, if desired, additional encapsulation regions and/or structures may be formed as performed in the previous embodiments to at least partially enclose the semiconductor die 20 using an electrically conductive polymerized material to assist with ESD and RF shielding.

Figure 12A:
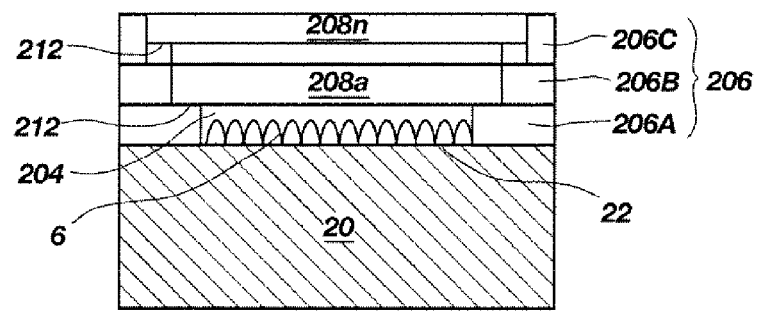
FIGS. 12A and 12B illustrate sectional views of an optically interactive semiconductor device packaged using various photopolymer materials.
Figure 12B:
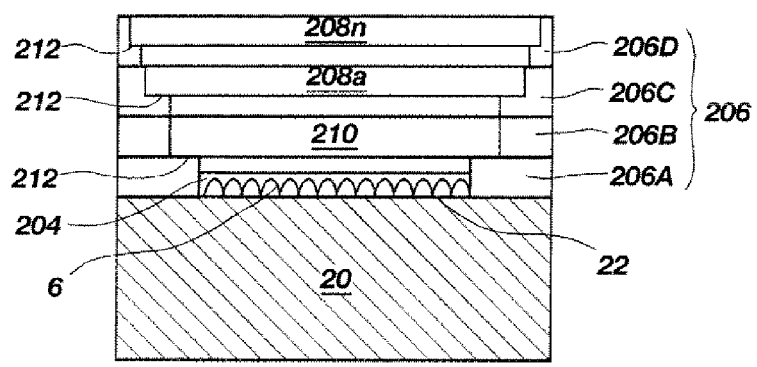

Referring to FIGS. 12A and 12B, a sectional view of an optically interactive semiconductor device that is packaged using various photopolymer materials is illustrated. Semiconductor die 20 includes an array 6 of optically interactive semiconductor devices such as, for example, CCD image sensors or CMOS image sensors on its active surface 22. The array 6 of optically interactive semiconductor devices may include a cover 204 formed from a photopolymer material that seals and protects array 6 and is transparent to light, preferably in the 400 nm to 650 nm wavelength range. In an exemplary embodiment shown in FIG. 12A, cover 204 may be formed from an optically transparent photopolymerized material that filters infrared (IR) radiation. The array 6 of optically interactive semiconductor devices may also be surrounded along substantially all of its periphery by a support structure 206 including ledges 212 that supports at least one lens 208a-208n for focusing light onto the array 6. Support structure 206 may be formed from a photopolymerized material that is opaque. Suitable photopolymer materials for forming support structure 206 are any of the above mentioned commercially available liquid photopolymer resins or a photopolymer material that comprises a polymerized matrix having a filler constituent such as, for example, an elemental metal or alloy dispersed therethrough. For example, a photopolymer material that comprises approximately 50 volume percent of a metallic particulate filler constituent will be substantially opaque and suitable for forming the support structure 206. Thus, the photopolymer material that comprises support structure 206 may shield array 6 of optically interactive semiconductor devices, substantially allowing only light entering through a lens 208 to be received by the array 6. If cover 204 is formed from a photopolymer material that absorbs IR radiation, a traditional IR filter is not needed.

An IR filter 210 is necessary to filter IR radiation from being received by the array 6 if cover 204 does not absorb IR radiation. As shown in FIG. 12B, an IR filter 210 and at least one lens 208a-208n may be supported by ledges 212 of the support structure 206. Cover 204 formed from an optically transparent photopolymer may, optionally, be used to seal and protect array 6. Although, not shown in FIGS. 12A and 12B, it should be understood that the semiconductor die 20 includes external conductive elements for electrically connecting semiconductor die 20 to other semiconductor devices or higher level packaging, such as a printed circuit board. Such external conductive elements may also be formed using stereolithographic techniques, as desired.

The package for the optically interactive semiconductor device may be formed using stereolithography methods similar to those used in the previous embodiments. The semiconductor die 20 may be immersed in the liquid photopolymer resin 60 to the desired depth. The liquid photopolymer resin 60 may be scanned by laser 108 to cure or at least partially cure a portion thereof to form cover 204 that covers the array 6. Cover 204 may be formed, if needed, by multiple iterative steps to build up cover 204 from multiple layers. The liquid photopolymer resin 60 may then be changed to another and the semiconductor die 20 re-immersed therein. The liquid photopolymer resin 60 is scanned by laser 108 to cure or at least partially cure a portion thereof to surround the periphery of array 6 with a support structure 206A. If needed, the above process may be repeated to form support structure 206B that is contiguous with support structure 206A and additional support structures 206C-206n. It should be understood, that support structure 206 may be formed prior to or subsequent to forming cover 204. Lenses 208a-208n, IR filter 210, or both may then be fixed to support structure 206 using an adhesive or other suitable technique.

Although the foregoing description contains many specifics, these are not to be construed as limiting the scope of the present invention, but merely as providing certain exemplary embodiments. Similarly, other embodiments of the invention may be devised that do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. A device comprising at least one semiconductor die including at least one surface at least partially covered by a first cured photopolymer material comprising a plurality of discrete particles dispersed through a polymerized matrix.

2. The device of claim 1, wherein the first cured photopolymer material covers a back side of the at least one semiconductor die, and wherein a second cured photopolymer material substantially fills a volume between the at least one semiconductor die and a carrier substrate and surrounds a lateral periphery of the at least one semiconductor die to form a contiguous structure with the first cured photopolymer material.

3. The device of claim 2, wherein the first cured photopolymer material exhibits a thermal conductivity greater than that of the second cured photopolymer material.

4. The device of claim 3, wherein the discrete particles comprise boron nitride.

5. The device of claim 1, further comprising:
a second cured photopolymer material that substantially fills a volume between the at least one semiconductor die and a carrier substrate; and
wherein the first cured photopolymer material at least partially encloses the at least one semiconductor die including the second photopolymerized material.

6. The device of claim 5, wherein the first cured photopolymer material exhibits an electrical conductivity greater than an electrical conductivity of the second cured photopolymer material.

7. The device of claim 1, wherein the first cured photopolymer material substantially fills a volume between the at least one semiconductor die and a carrier substrate, the first cured photopolymer material exhibiting a gradient in coefficient of thermal expansion that increases in a direction from an active surface of the at least one semiconductor die to a face of a carrier substrate.

8. The device of claim 7, wherein the first cured photopolymer material is comprised of more than one layer, each layer having a different concentration of the discrete particles.

9. The device of claim 8, further comprising a second cured photopolymer material that covers a back side and at least a portion of at least one lateral side of the at least one semiconductor die.

10. The device of claim 9, wherein the second cured photopolymer material comprises a polymerized matrix having a plurality of discrete particles dispersed therethrough.

11. The device of claim 10, wherein the discrete particles of the second cured photopolymer material comprise boron nitride.

12. The device of claim 9, further comprising a third cured photopolymer material comprising a polymerized matrix having a plurality of discrete particles dispersed therethrough at least partially enclosing the at least one semiconductor die including the first and the second cured photopolymer materials, wherein the third cured photopolymer material exhibits an electrical conductivity greater than an electrical conductivity of each of the first and the second cured photopolymer materials.

13. A semiconductor device assembly comprising:
a plurality of semiconductor dice each attached to a substrate; and
an at least partially cured photopolymer material covering at least a portion of each semiconductor die of the plurality of semiconductor dice, the at least partially cured photopolymer material comprising a plurality of discrete particles dispersed throughout a polymerized matrix.

14. The semiconductor device assembly of claim 13, wherein the at least partially cured photopolymer material covers at least a portion of a back side of each semiconductor die of the plurality of semiconductor dice, and wherein an additional at least partially cured photopolymer material substantially fills a volume between the substrate and each semiconductor die of the plurality of semiconductor dice.

15. The semiconductor device assembly of claim 13, wherein the at least partially cured photopolymer material substantially fills a volume between the substrate and each semiconductor die of the plurality of semiconductor dice, the at least partially cured photopolymer material exhibiting a gradient in coefficient of thermal expansion that increases in a direction from an active surface of each semiconductor die of the plurality of semiconductor dice to the substrate.

16. A semiconductor device assembly comprising:
a plurality of semiconductor dice each attached to a substrate;
a first at least partially cured photopolymer material covering at least a portion of each semiconductor die of the plurality of semiconductor dice; and a second at least partially cured photopolymer material covering at least another portion of each semiconductor die of the plurality of semiconductor dice;

wherein at least one of the first and second at least partially cured photopolymer materials includes a plurality of discrete particles dispersed throughout a polymerized matrix.

17. The semiconductor device assembly of claim 16, wherein the first at least partially cured photopolymer material covers at least a portion of a back side of each semiconductor die of the plurality of semiconductor dice, and wherein the second at least partially cured photopolymer material substantially fills a volume between the substrate and each semiconductor die of the plurality of semiconductor dice.

18. The semiconductor device assembly of claim 17, wherein at least one of the first and second at least partially cured photopolymer materials further surrounds at least a portion of a lateral periphery of each semiconductor die of the plurality of semiconductor dice.

19. The semiconductor device assembly of claim 16, wherein the discrete particles comprise boron nitride.

20. The semiconductor device assembly of claim 16, wherein at least one of the first and second at least partially cured photopolymer materials is comprised of two or more layers, at least two layers of the two or more layers including a different concentration of the discrete particles.

* * * * *